(12) United States Patent
Yamamoto et al.

(10) Patent No.: US 7,984,737 B2
(45) Date of Patent: Jul. 26, 2011

(54) ADHESIVE TAPE CUTTING METHOD AND ADHESIVE TAPE JOINING APPARATUS USING THE SAME

(75) Inventors: Masayuki Yamamoto, Osaka (JP); Saburo Miyamoto, Mie-ken (JP)

(73) Assignee: Nitto Denko Corporation, Osaka (JP)

( * ) Notice: Subject to any disclaimer, the term of this patent is extended or adjusted under 35 U.S.C. 154(b) by 178 days.

(21) Appl. No.: 11/898,831

(22) Filed: Sep. 17, 2007

(65) Prior Publication Data
US 2008/0066869 A1 Mar. 20, 2008

(30) Foreign Application Priority Data

Sep. 20, 2006 (JP) .................. 2006-254256

(51) Int. Cl.
*B26D 5/00* (2006.01)
(52) U.S. Cl. .......... 156/353; 156/64; 156/350; 156/378; 156/379; 156/510; 156/522; 83/48; 83/76.7; 83/76.8; 83/79; 83/80; 83/286; 83/289; 83/359; 83/365; 83/361
(58) Field of Classification Search .................... 156/64, 156/353, 378, 379, 510, 522; 83/43, 62.1, 83/72, 74, 76.7, 76.8, 79, 80, 286, 289, 359, 83/365, 361
See application file for complete search history.

(56) References Cited

U.S. PATENT DOCUMENTS

| | | | | |
|---|---|---|---|---|
| 4,660,980 A * | 4/1987 | Takabayashi et al. | ........ | 356/504 |
| 5,650,851 A * | 7/1997 | Gagnon | ........ | 356/504 |
| 6,341,548 B1 * | 1/2002 | Hirahata et al. | ........ | 83/881 |
| 6,767,426 B1 * | 7/2004 | Yamamoto | ........ | 156/270 |
| 2001/0002569 A1 | 6/2001 | Lee et al. | | |
| 2003/0133762 A1 * | 7/2003 | Yamamoto et al. | ........ | 406/198 |
| 2005/0081988 A1 * | 4/2005 | Yamamoto | ........ | 156/267 |
| 2005/0115666 A1 | 6/2005 | Yamamoto | | |

FOREIGN PATENT DOCUMENTS

| | | |
|---|---|---|
| EP | 1 912 250 A1 | 4/2008 |
| JP | 62-174940 A | 7/1987 |
| JP | 6-196557 A | 7/1994 |
| JP | 2005-191232 A | 7/2005 |

OTHER PUBLICATIONS

Partial European Search Report for the Application No. EP 07 01 8477 dated Mar. 8, 2010.
European Search Report for the Application No. EP 07 01 8477 dated Aug. 5, 2010.
European Office Action for the Application No. 07 018 477.5 Apr. 5, 2011.

* cited by examiner

*Primary Examiner* — Kat Wyrozebski
*Assistant Examiner* — Joshel Rivera
(74) *Attorney, Agent, or Firm* — Cheng Law Group, PLLC

(57) ABSTRACT

In a state that a reference plane of a cutter holder, to which a cutter blade is attached, is brought into contact with a surface of a base of a supporting adhesive tape, the cutter blade cuts the supporting adhesive tape while the reference plane of the cutter holder follows the surface of the base. Herein, a cutting edge of the cutter blade passes by a joining interface between the supporting adhesive tape and a ring frame without penetrating through an adhesive layer of the supporting adhesive tape.

4 Claims, 8 Drawing Sheets

ADHESIVE TAPE CUTTING METHOD AND ADHESIVE TAPE JOINING APPARATUS USING THE SAME

BACKGROUND OF THE INVENTION (1) Field of the Invention

The present invention relates to an adhesive tape cutting method for joining a supporting adhesive tape to a ring frame and a semiconductor wafer such that the ring frame holds the semiconductor wafer, and then cutting the adhesive tape in such a manner that a cutter blade travels along a contour of the ring frame, and an adhesive tape joining apparatus using the same. In particular, the present invention relates to a technique for improving adhesive tape cutting efficiency.

(2) Description of the Related Art

A semiconductor wafer (hereinafter, simply referred to as a "wafer") having a front face on which a pattern is formed is made thinner in thickness by back grinding. The wafer subjected to the back grinding is transported to a mount apparatus. In the mount apparatus, the wafer is joined to and held by a ring frame through a supporting adhesive tape. Herein, a disc-shaped cutter blade capable of rotating freely is pressed against the strip-shaped adhesive tape joined to the ring frame and the wafer positioned at a center of the ring frame; thus, the adhesive tape is cut along a contour of the ring frame (refer to JP-A 62-174940).

It is considered herein that the adhesive tape is cut in the conventional manner. In the case where the adhesive tape is cut by the cutter blade, first, a cutting edge of the cutter blade penetrates through the adhesive tape. Thereafter, the cutter blade travels in a state that the cutting edge thereof is pressed against a tape joined side of the ring frame. Consequently, the cutting edge of the cutter blade is susceptible to wear. This causes a problem that the cutter blade must be exchanged frequently because a service life thereof becomes short.

In the cutting of the adhesive tape, moreover, a notched groove is formed on the tape joined side of the ring frame by the contact with the cutting edge of the cutter blade. In a case that such a ring frame is reused, if an adhesive tape joined to the ring frame is cut by the cutter blade, the cutting edge of the cutter blade penetrates through the adhesive tape and, then, is fitted into the notched groove formed on the surface of the ring frame, so that the cutter blade travels on a pathway which is different from a preset traveling pathway. This causes a problem of a cutting failure that the adhesive tape cannot be cut along the contour of the ring frame because a cutting start position does not correspond with a cutting end position.

SUMMARY OF THE INVENTION

An object of the present invention is to provide an adhesive tape cutting method capable of efficiently cutting a supporting adhesive tape used for allowing a ring frame to hold a semiconductor wafer, and an adhesive tape joining apparatus using the same.

In order to accomplish the aforementioned object, the present invention adopts the following configuration:

A method for cutting a supporting adhesive tape through which a ring frame holds a semiconductor wafer, the method comprising the step of cutting an adhesive tape along a contour of a ring frame while maintaining constant a distance from a reference plane of a cutter holder, which is an attachment base end of a cutter blade, to a portion to be cut of the adhesive tape joined to the ring frame.

With the method according to the present invention, the distance from the reference plane to the portion to be cut is made constant at the time when the adhesive tape is cut. Therefore, it is possible to reduce a load applied when the cutting edge of the cutter blade comes into contact with the tape joined side of the ring frame in the cutting of the adhesive tape. For example, the adhesive tape is cut while maintaining a distance that the cutting edge of the cutter blade is positioned at an adhesive layer which is close to a joining interface between the ring frame and the adhesive tape; thus, the cutter blade can cut the adhesive tape without contact with the ring frame. Accordingly, it is possible to prolong a service life of the cutter blade and to reduce a frequency of exchange of the cutter blade. Thus, it is possible to improve workability.

If the cutting edge does not come into contact with the ring frame, a notched groove is not formed on the ring frame and, further, the ring frame suffers no damage. In this case, there is no disadvantage that the cutting edge is fitted into the notched groove so that a cutting pathway of the cutter blade varies. As a result, a cutting start position corresponds with a cutting end position; thus, there occurs no cutting failure.

Preferably, the distance from the reference plane to the portion to be cut corresponds to, for example, a distance from a position where the reference plane of the cutter holder comes into contact with a surface of the adhesive tape to a cutting edge of the cutter blade.

With this configuration, the reference plane follows the surface of the adhesive tape; therefore, a distance for cutting the adhesive tape can be made constant in a thickness direction. That is, it is possible to suitably implement the aforementioned method.

Preferably, a distance from the reference plane to the cutting edge of the cutter blade is measured and is adjusted so as to be constant each time the adhesive tape is cut by a predetermined number of times.

With this configuration, even when the cutting edge of the cutter blade is worn, the distance from the reference plane to the cutting edge of the cutter blade is almost made constant. Therefore, the adhesive tape can be cut without fail.

In order to accomplish the aforementioned object, the present invention also adopts the following configuration:

A method for cutting a supporting adhesive tape through which a ring frame holds a semiconductor wafer, the method comprising the step of measuring a thickness of an adhesive tape on a cutting pathway of a cutter blade, and cutting the adhesive tape while adjusting a position of a cutting edge of the cutter blade in accordance with a result of the measurement.

For example, light is emitted to the adhesive tape, both light which transmits through the adhesive tape and is reflected from the ring frame and light which is reflected from a surface of the adhesive tape are received, and the thickness of the adhesive tape is measured on the basis of at least one of intensity and timing of the reflected light.

With this configuration, for example, the distance from the surface of the ring frame to the cutting edge can be made constant.

In order to accomplish the aforementioned object, the present invention also adopts the following configuration:

An apparatus for joining a semiconductor wafer to a ring frame through a supporting adhesive tape such that the ring frame holds the semiconductor wafer, the apparatus comprising: wafer holding means for holding a semiconductor wafer; frame holding means for holding a ring frame so as to be opposite to the semiconductor wafer held by the wafer holding means; tape supply means for supplying a strip-shaped supporting adhesive tape toward the ring frame; joining means allowing a joining member to move while being pressed against a non-adhesive surface of the adhesive tape, for joining the semiconductor wafer to the ring frame such that the ring frame holds the semiconductor wafer; a cutting mechanism for cutting the adhesive tape along a contour of the ring frame while allowing a reference plane of a cutter holder, which is a cutter blade attachment base end, to follow the surface of the adhesive tape joined to the ring frame; and removal means for removing the unnecessary portion of the adhesive tape from the ring frame.

With the apparatus according to the present invention, the supporting adhesive tape joined to the ring frame and the semiconductor wafer can be cut along the contour of the ring frame in a state that a distance from the cutting edge of the cutter blade, with which the adhesive tape is stuck, to the adhesive tape is made constant. That is, it is possible to suitably realize the aforementioned method.

Preferably, the apparatus further comprises: measurement means for measuring a distance from the reference plane of the cutter holder of the cutting mechanism to a cutting edge of the cutter blade; a control section for calculating a correction amount for correcting a length of the cutter blade protruding from the cutter holder in accordance with a deviation obtained by comparison of a value measured by the measurement means with a predetermined reference value; and drive means for adjusting a protruding length of the cutter blade in accordance with the correction amount obtained by the control section.

With this configuration, the cutting edge of the cutter blade is measured. On the basis of a result of the measurement, a length of the cutter blade can be adjusted in such a manner that the cutter blade is pulled from the cutter holder even when the cutter becomes shorten due to wear. Thus, the length of the cutting edge can be made constant. That is, it is possible to suitably implement the aforementioned method.

In order to accomplish the aforementioned object, the present invention also adopts the following configuration:

An apparatus for joining a semiconductor wafer to a ring frame through a supporting adhesive tape such that the ring frame holds the semiconductor wafer, the apparatus comprising: wafer holding means for holding a semiconductor wafer; frame holding means for, holding a ring frame so as to be opposite to the semiconductor wafer held by the wafer holding means; tape supply means for supplying a strip-shaped supporting adhesive tape toward the ring frame; joining means allowing a joining member to move while being pressed against a non-adhesive surface of the adhesive tape, for joining the semiconductor wafer to the ring frame such that the ring frame holds the semiconductor wafer; a cutting mechanism allowing the ring frame and a cutter blade to relatively move along a contour of the ring frame, for cutting the adhesive tape; measurement means for measuring a thickness of the adhesive tape on a cutting pathway of the cutter blade when the cutting mechanism cuts the adhesive tape; control means for controlling a position of a cutting edge on the basis of a result of the measurement by the measurement means; and removal means for removing the unnecessary portion of the adhesive tape from the ring frame.

With the apparatus according to the present invention, it is possible to suitably realize the aforementioned method.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENT

Hereinafter, description will be given of one embodiment of the present invention with reference to the drawings.

Figure 1:
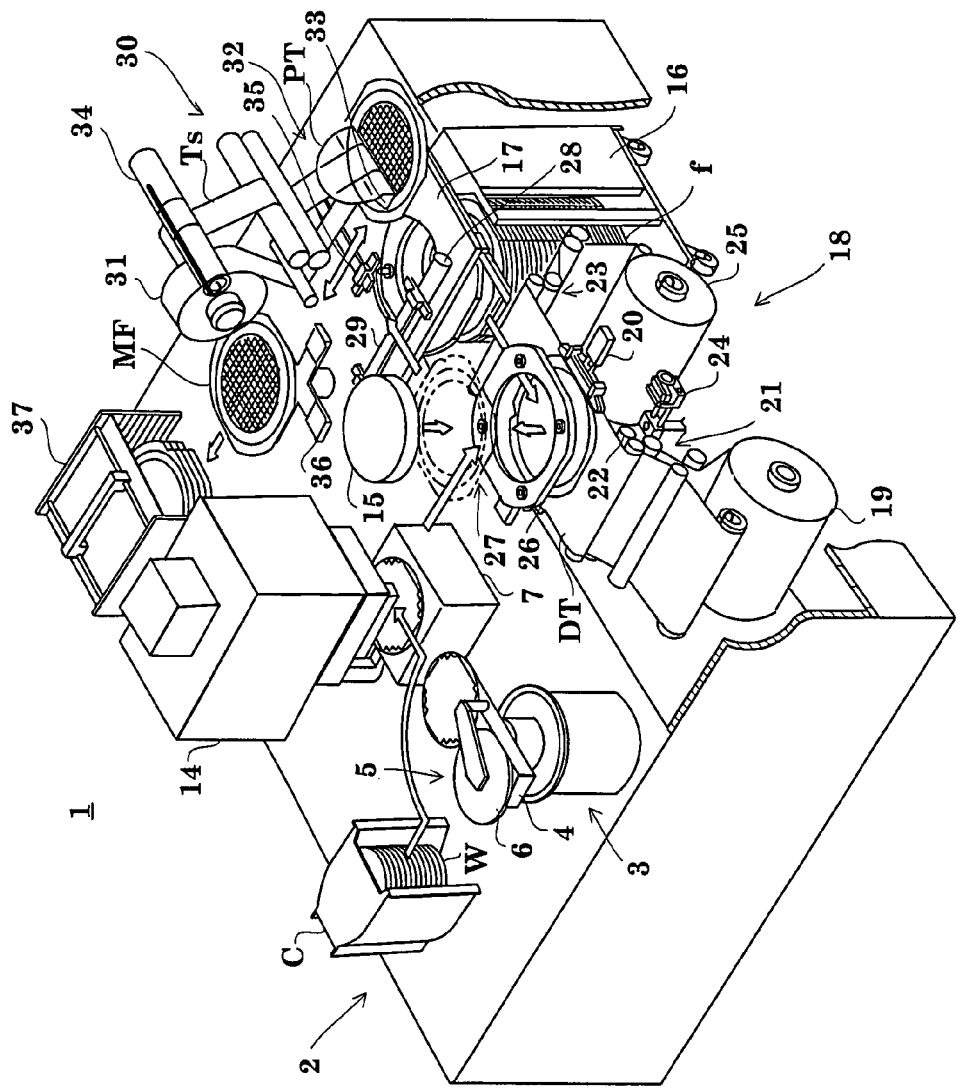
FIG. 1 is a perspective view illustrating a general configuration of a semiconductor wafer mount apparatus according to an embodiment of the present invention.

FIG. 1 is a cutaway perspective view illustrating a general configuration of a semiconductor wafer mount apparatus according to one embodiment of the present invention.

The semiconductor wafer mount apparatus 1 according to this embodiment includes a wafer supply section 2, a wafer transport mechanism 3, an alignment stage 7, an ultraviolet-ray irradiation unit 14, a chuck table 15, a ring frame supply section 16, a ring frame transport mechanism 17, a tape processing section 18, a ring frame lift mechanism 26, a mount frame preparation section 27, a first mount frame transport mechanism 29, a separation mechanism 30, a second mount frame transport mechanism 35, a turn table 36 and a mount frame collection section 37. Herein, the wafer supply section 2 includes a cassette C housing wafers W, each subjected to a back grinding process, in a stacked manner. The wafer transport mechanism 3 includes a robot arm 4 and a pressing mechanism 5. The alignment stage 7 performs alignment on a wafer W. The ultraviolet-ray irradiation unit 14 irradiates, with ultraviolet rays, a wafer W placed on the alignment stage 7. The chuck table 15 suction holds a wafer W. The ring frame supply section 16 houses ring frames f in a stacked manner. The ring frame transport mechanism 17 transfers a ring frame f to a supporting adhesive tape DT which is a dicing tape. The tape processing section 18 joins the supporting adhesive tape DT to a bottom side of a ring frame f. The ring frame lift mechanism 26 allows a ring frame f, to which the adhesive tape DT is joined, to move vertically. The mount frame preparation section 27 joins and integrates a wafer W to and into a ring frame f, to which the adhesive tape DT is joined, thereby preparing a mount frame MF. The first mount frame transport mechanism 29 transports a mount frame MF. The separation mechanism 30 separates a protective tape PT joined to a front face of a wafer W. The second mount frame transport mechanism 35 transports a mount frame MF in which a protective tape PT is separated from a wafer W. The turn table 36 changes a direction of a mount frame MF, and transports the mount frame MF. The mount frame collection section 37 houses mount frames MF in a stacked manner.

The wafer supply section 2 is provided with a cassette bench (not illustrated). The cassette C is placed on the cassette bench and houses wafers W, each having a patterned face (hereinafter, appropriately referred to as a "front face") to which a protective tape PT is joined, in a stacked manner. Herein, each wafer W is in a horizontal position while a patterned face thereof is directed upward.

The wafer transport mechanism 3 is turned and vertically moved by a drive mechanism (not illustrated). More specifically, the wafer transport mechanism 3 adjusts a position of a wafer holding part (to be described later) of the robot arm 4 and a position of a pressing plate 6 (to be described later) of the pressing mechanism 5, and transports a wafer W from the cassette C to the alignment stage 7.

In the wafer transport mechanism 3, the wafer holding part (not illustrated) is provided at a tip end of the robot arm (hereinafter, simply referred to as the "arm") 4 and is formed into a horse-shoe shape. The wafer holding part of the arm 4 can be inserted between wafers W housed in the cassette C in a stacked manner. Herein, the wafer holding part provided at the tip end of the arm 4 includes a suction hole for holding a back face of a wafer W by vacuum suction.

In the wafer transport mechanism 3, the pressing plate 6 is provided at a tip end of the pressing mechanism 5 and is formed into a circular shape which is almost identical to a shape of a wafer W. The pressing plate 6 has an arm portion which can advance/retreat so as to move above a wafer W placed on the alignment stage 7. Herein, the shape of the pressing plate 6 is not limited to the circular shape as long as the pressing plate 6 can correct warpage occurring at a wafer W. For example, a tip end of a rod-like member may be pressed against a warped wafer W.

The pressing mechanism 5 is actuated if a suction failure occurs at a time when a wafer W is placed on a holding table (to be described later) of the alignment stage 7. Specifically, if the holding table cannot suction hold a warped wafer W, the pressing plate 6 presses a front face of the wafer W, thereby correcting the warpage, that is, flattening the wafer W. In this state, the holding table vacuum sucks a back face of the wafer W.

The holding table of the alignment stage 7 performs alignment on a wafer W placed thereon on the basis of an orientation flat or a notch formed at an outer periphery of the wafer W, and entirely vacuum sucks a back face of the wafer W.

Moreover, the holding table of the alignment stage 7 suction holds a wafer W in a state that warpage occurring at the wafer W is corrected by the pressing plate 6.

Further, the alignment stage 7 is movable. That is, the alignment stage 7 moves from an initial position to an intermediate position while suction holding a wafer W. At the initial position, herein, the alignment stage 7 performs alignment on a wafer W placed thereon. Further, the intermediate position is located between the chuck table 15 and the ring frame lift mechanism 26 each disposed above the tape processing section 18 in a vertical direction (to be described above).

The ultraviolet-ray irradiation unit 14 is disposed above the alignment stage 7 situated at the initial position. The ultraviolet-ray irradiation unit 14 irradiates, with ultraviolet rays, a protective tape PT which is a ultraviolet-ray curable type adhesive tape and is joined to a front face of a wafer W. In other words, the ultraviolet-ray irradiation unit 14 intends to lower adhesion of the protective tape PT by irradiation with the ultraviolet rays.

The chuck table 15 is formed into a circular shape which is almost identical to a shape of a wafer W so as to entirely vacuum suck a front face of the wafer W, and is vertically moved from a standby position located above the tape processing section 18 to a position where the wafer W is joined to a ring frame f, by a drive mechanism (not illustrated).

In other words, the chuck table 15 comes into contact with a wafer W held by the holding table while being flattened, and then suction holds the wafer W.

Moreover, the chuck table 15 is inserted in an opening of the ring frame lift mechanism 26 for suction holding a ring frame f having a bottom side to which an adhesive tape DT is joined (to be described later). Then, the chuck table 15 moves downward to a position where a wafer W is close to the adhesive tape DT at a center of the ring frame f.

Herein, the chuck table 15 and the ring frame lift mechanism 26 are held by a holding mechanism (not illustrated). It is to be noted that the chuck table 15 corresponds to wafer holding means according to the present invention and the ring frame lift mechanism 26 corresponds to frame holding means according to the present invention.

The ring frame supply section 16 is of a wagon type, and has a bottom side on which wheels are provided. Moreover, the ring frame supply section 16 is housed in a main body of the semiconductor wafer mount apparatus 1. Further, the ring frame supply section 16 has the following configuration that ring frames f housed therein in a stacked manner sequentially slide upward and are taken out of an upper opening thereof.

The ring frame transport mechanism 17 vacuum sucks uppermost one of ring frames f housed in the ring frame supply section 16 one by one, and then transports the ring frame f to an alignment stage (not illustrated) and a position where the adhesive tape DT is joined to the ring frame f in succession. The ring frame transport mechanism 17 also serves as a holding mechanism for holding the ring frame f at the position where the adhesive tape DT is joined to the ring frame f.

The tape processing section 18 includes a tape supply section 19, a tensioning mechanism 20, a joining unit 21, a tape cutting mechanism 24, a removal unit 23 and a tape collection section 25. Herein, the tape supply section 19 supplies the adhesive tape DT. The tensioning mechanism 20 applies a tension to the adhesive tape DT. The joining unit 21 joins the adhesive tape DT to a ring frame f. The tape cutting mechanism 24 cuts the adhesive tape DT joined to the ring frame f. The removal unit 23 removes the unnecessary portion of the adhesive tape DT cut by the tape cutting mechanism 24 from the ring frame f. The tape collection section 25 collects the cut unnecessary tape. It is to be noted that the tape supply section 19 corresponds to tape supply means according to the present invention, the joining unit 21 corresponds to joining means according to the present invention, the tape cutting mechanism 24 corresponds to a cutting mechanism according to the present invention, and the removal unit 23 corresponds to removal means according to the present invention.

The tensioning mechanism 20 grasps both ends of the adhesive tape DT in a width direction to apply a tension to the adhesive tape DT in the tape width direction. If the adhesive tape DT to be used herein is soft, a tension applied thereto in a tape supplying direction causes vertical wrinkles on a surface thereof in the tape supplying direction. In order to avoid generation of such vertical wrinkles and to uniformly join the adhesive tape DT to a ring frame f, the tensioning mechanism 20 applies the tension to the adhesive tape DT in the tape width direction.

The joining unit 21 is disposed at a standby position located obliquely downward of a ring frame f held above the adhesive tape DT (an obliquely lower left portion in FIG. 1). The joining unit 21 includes a joining roller 22. When the ring frame transport mechanism 17 transports the ring frame f to an adhesive tape joining position and, then, the tape supply section 19 starts to supply the adhesive tape DT toward the ring frame f, concurrently, the joining roller 22 moves to a joining operation start position located at a right end in the tape supplying direction.

After arrival at the joining operation start position, the joining roller 22 moves upward to press the adhesive tape DT against the ring frame f. Then, the joining roller 22 rolls on the adhesive tape DT from the joining operation start position toward a standby position; thus, the adhesive tape DT is joined to the ring frame f. It is to be noted that the joining roller 22 corresponds to a joining member according to the present invention.

The removal unit 23 removes the unnecessary portion of the adhesive tape DT cut by the tape cutting mechanism 24 (to be described later) from the ring frame f. More specifically, after completion of the joining of the adhesive tape DT to the ring frame f and the cutting of the adhesive tape DT, the tensioning mechanism 20 releases the grasp of the adhesive tape DT. Then, the removal unit 23 moves toward the tape supply section 19 over the ring frame f, and removes the unnecessary portion of the adhesive tape DT from the ring frame f.

The tape cutting mechanism 24 is disposed below the adhesive tape DT when a ring frame f is placed thereon. When the joining unit 21 joins the adhesive tape DT to the ring frame f, the tensioning mechanism 20 releases the grasp of the adhesive tape DT. Thereafter, the tape cutting mechanism 24 moves upward, and then cuts the adhesive tape DT along a contour of the ring frame f. Hereinafter, description will be given of a specific configuration of the tape cutting mechanism 24.

Figure 2:
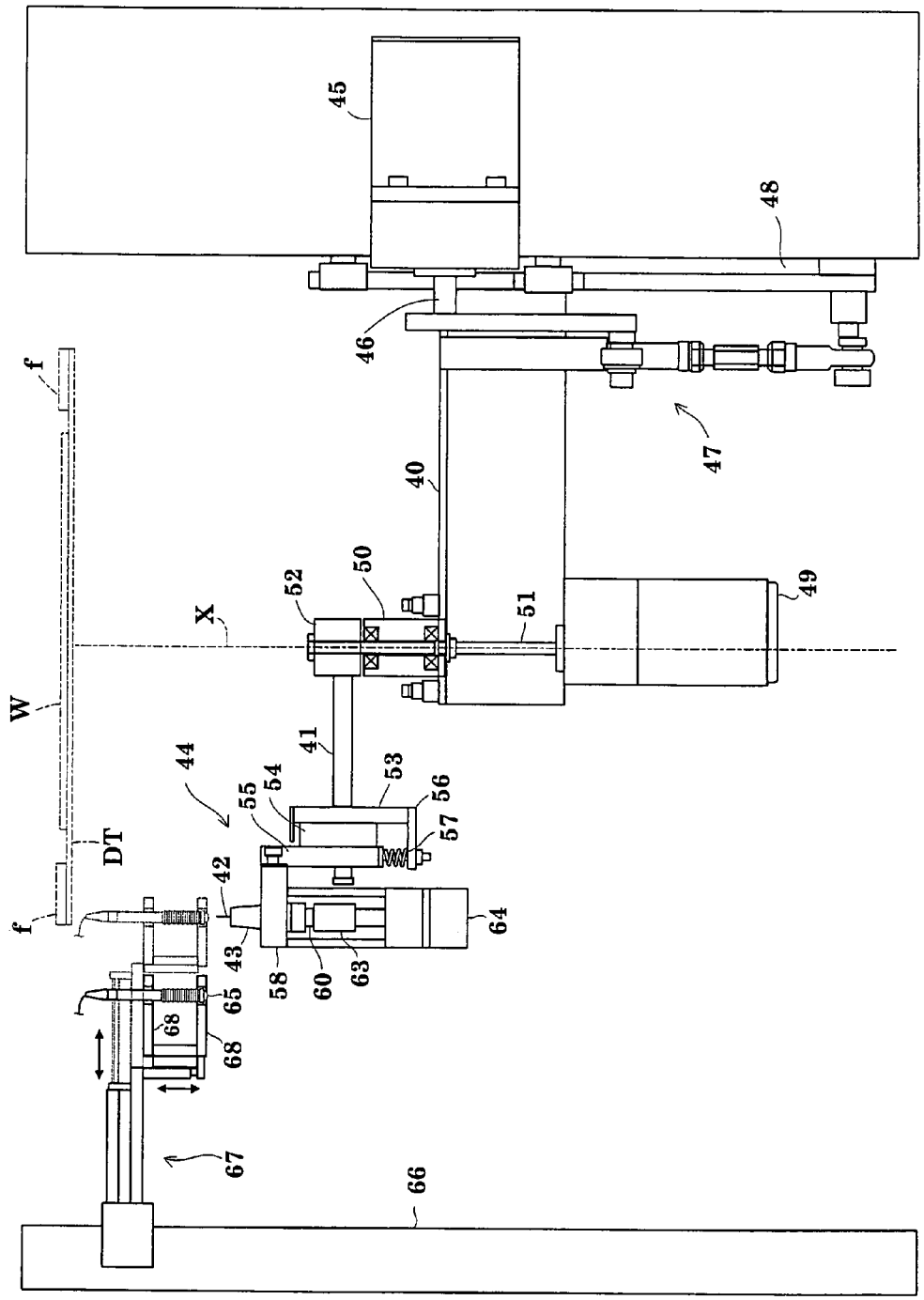
FIG. 2 is a front view illustrating a tape cutting mechanism.
Figure 3:
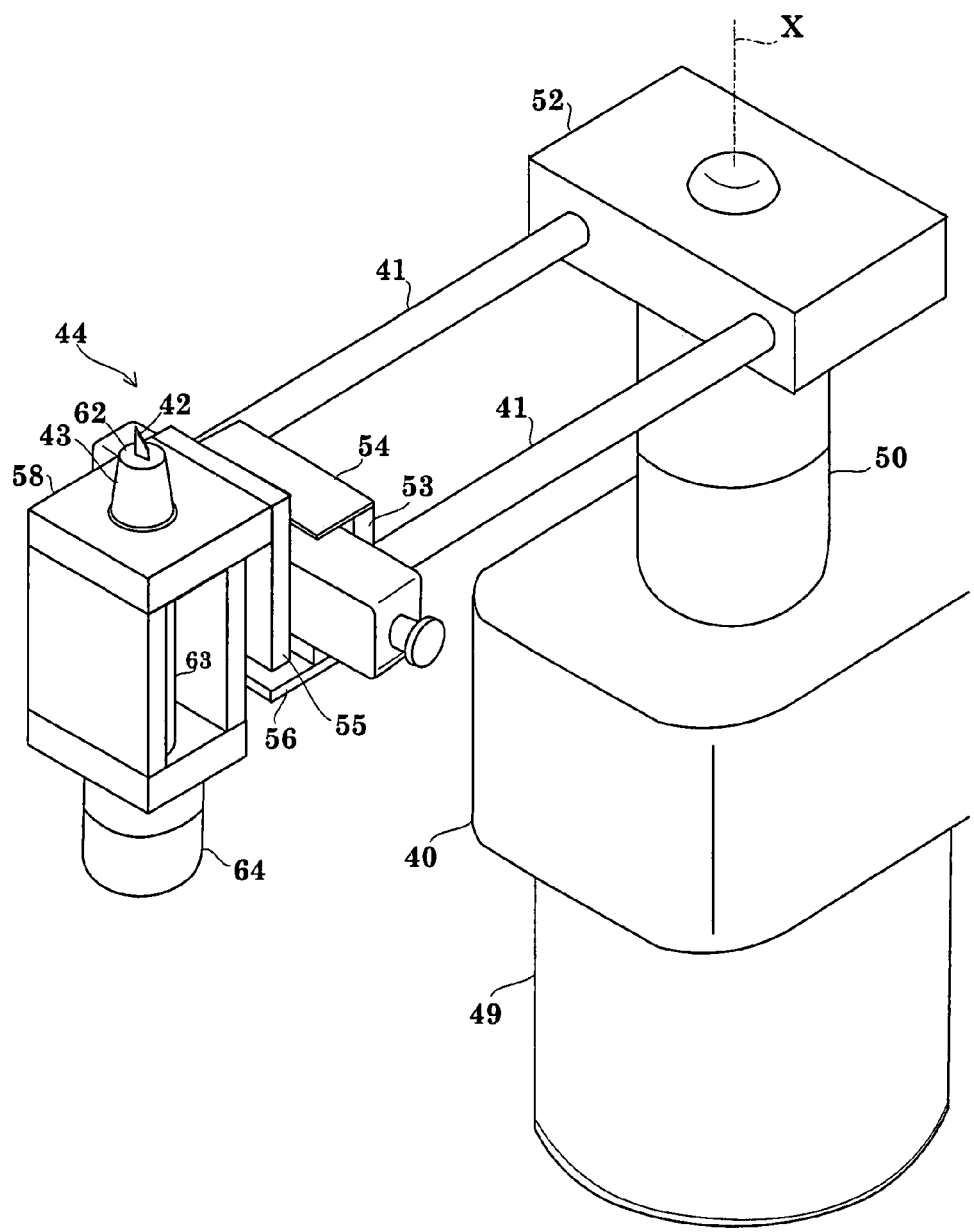
FIG. 3 is a perspective view illustrating main components of the tape cutting mechanism.

As illustrated in FIGS. 2 and 3, the tape cutting mechanism 24 has the following configuration that a pair of support arms 41 are provided in parallel on a movable bench 40 which is driven to move vertically. Herein, the pair of support arms 41 are situated above a center of a ring frame f and are driven to rotate about a vertical axis center X. In addition, a cutter unit 44 is provided at a free end side of the support arm 41. The cutter unit 44 includes a cutter holder 43 to which a cutter blade 42 is attached in a state that a cutting edge thereof is directed upward. When the support arms 41 are turned about the vertical axis center X, the cutter blade 42 travels along a contour of a ring frame f to which the adhesive tape DT is joined, thereby cutting the adhesive tape DT.

Figure 4:
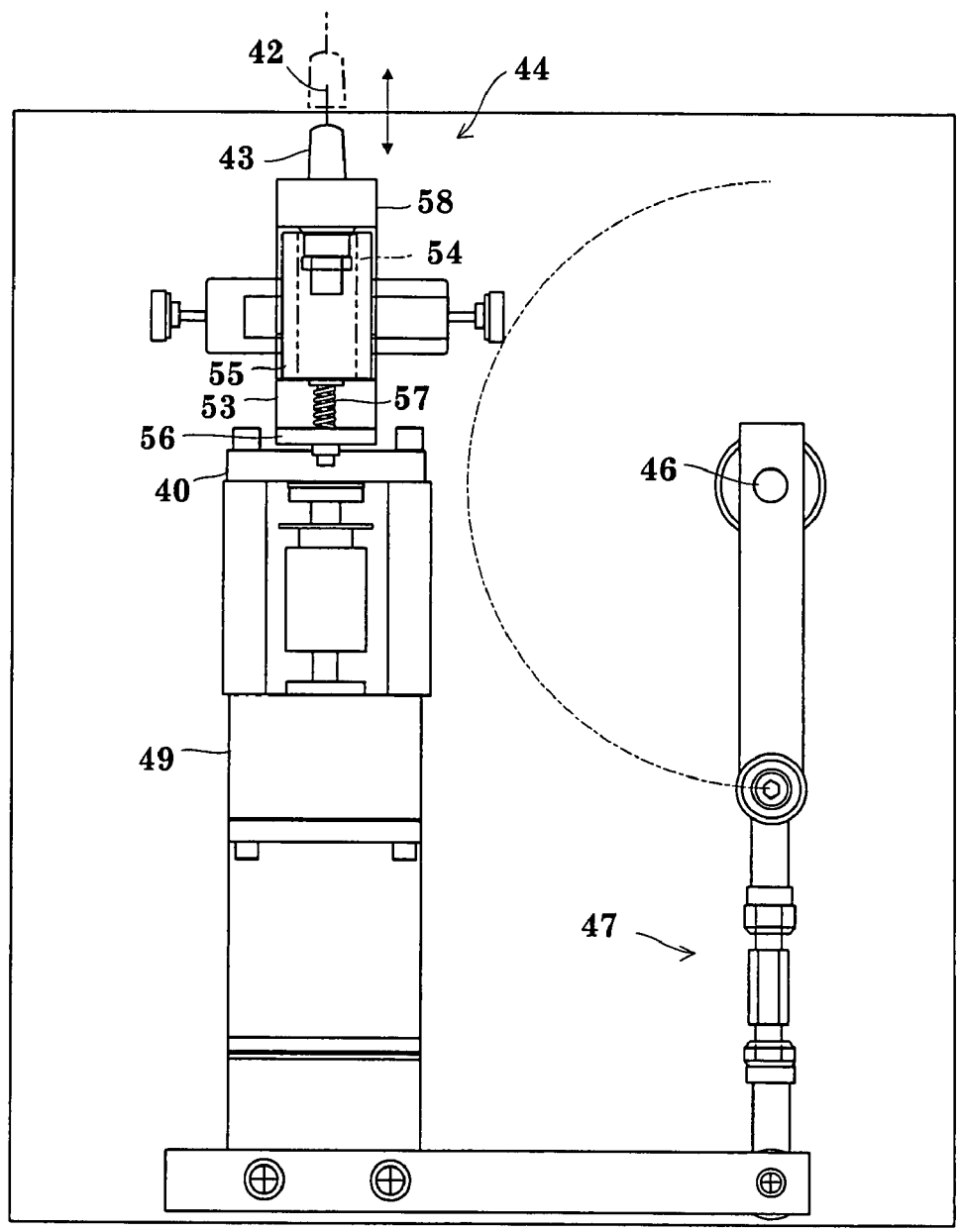
FIG. 4 is a plan view illustrating the main components of the tape cutting mechanism.

As illustrated in FIGS. 2 and 4, the movable bench 40 is coupled to a rotational shaft 46 of a motor 45 and a link mechanism 47 having three joints. When the motor 45 is driven in a forward/backward direction, the movable bench 40 moves vertically along a vertical rail 48. Further, a motor 49 is provided at a free end of the movable bench 40. A rotational shaft 51 of the motor 49 is coupled to a support member 52 through a bearing 50. The support arms 41 are supported by the support member 52 at a side end such that a sliding motion in a horizontal direction can be adjusted. By such an adjustment of the support arm 41, it is possible to change a distance from the cutter blade 42 to the vertical axis center X of the motor 45. In other words, it is possible to change and adjust a turning radius of the cutter blade 42 in response to a diameter of a ring frame f to be used.

A support bracket 53 is secured to the free end of the support arm 41. A unit movable bench 55 allows the cutter unit 44 to slide along a vertical rail 54 of the support bracket 53. A horizontal bracket 56 is attached to an end of the support bracket 53. The unit movable bench 55 and the horizontal bracket 56 are coupled to each other through a spring 57 such that the unit movable bench 55 is elastically biased in a direction that the cutter blade 42 moves upward.

Figure 5:
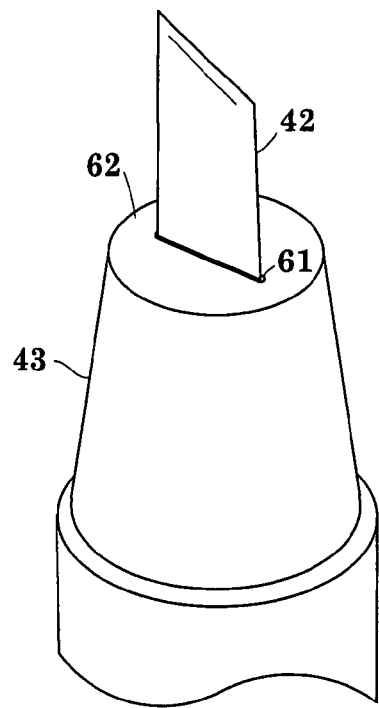
FIG. 5 is an enlarged perspective view illustrating a cutting edge of a cutter blade.

The cutter holder 43 is attached to a bracket 58 having a cylinder-shaped main body which is coupled to one end of the unit movable bench 55. A screw shaft 60 is screwed into a screw groove formed in an inner wall of the main body of the bracket 58. The cutter blade 42 is fixedly attached to an attachment block which is coupled to a first end of the screw shaft 60 through a bearing. As illustrated in FIG. 5, the cutter blade 42 advances from or retreats into an oval hole 61 formed at a tip end of the cutter holder 43 such that a protruding length of the cutter blade 42 is adjustable. Herein, the oval hole 61 is almost identical in shape to the cutter blade 42. The cutter holder 43 has a reference plane 62 from which the cutter blade 42 protrudes, and the reference plane 62 is flat. As illustrated in FIG. 2, further, a pulse motor 64 is coupled to a second end of the screw shaft 60 through a coupling rod 63. That is, the length of the cutter blade 42 protruding from the oval hole 61 of the cutter holder 43 can be adjusted when the pulse motor 64 is driven in a forward/backward direction.

Figure 7:
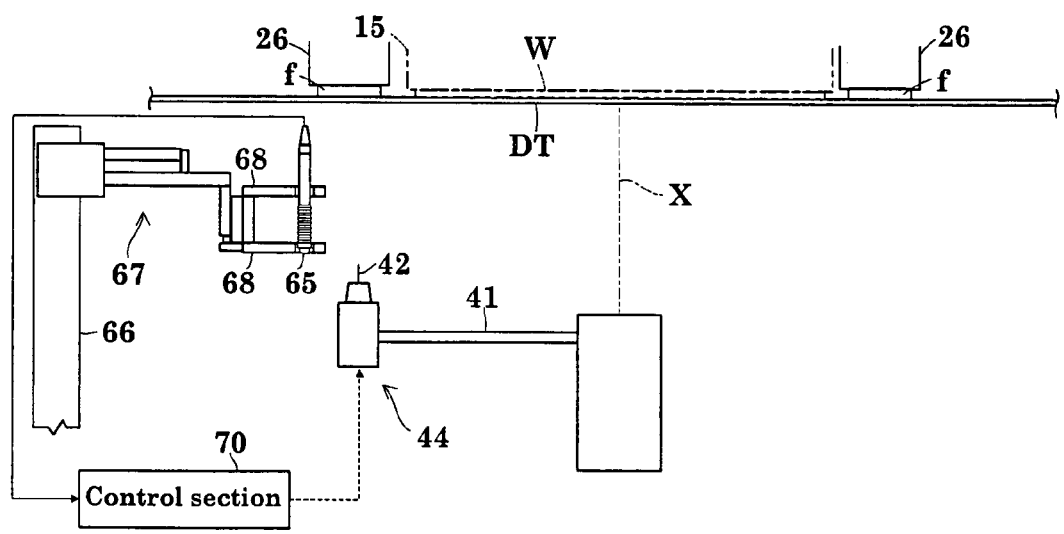
FIGS. 7 to 12 illustrate supporting adhesive tape cutting operations performed by the apparatus according to the embodiment.
Figure 8:
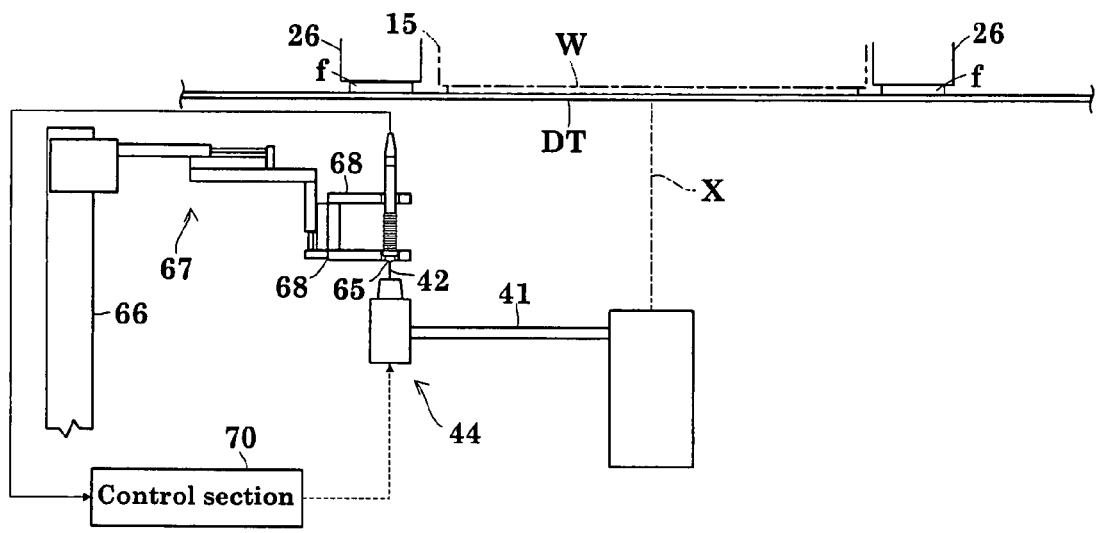

As illustrated in FIGS. 5, 7 and 8, a contact type displacement sensor 65 is disposed in the vicinity of the tape cutting mechanism 24 to measure the length of the cutter blade 42 protruding from the reference plane 62 of the cutter holder 43. The displacement sensor 65 is attached to a bracket 68 provided at a tip end of a robot arm 67 of a column 66. When a cylinder in the robot arm 67 expands or contracts, the robot arm 67 moves from a measurement position where the displacement sensor 65 is opposite to the cutting edge of the cutter blade 42 to a standby position which deviates from a traveling track of the cutter blade 42. At the measurement position, further, the bracket 68 provided at the tip end of the robot arm 67 can move vertically.

It is to be noted that the pulse motor 64 corresponds to drive means according to the present invention, and the displacement sensor 65 corresponds to measurement means according to the present invention. The measurement means is not limited to the displacement sensor 65, and may be either a contact type sensor or a non-contact type sensor as long as it can measure the length of the cutter blade 42 protruding from the cutter holder 43.

The ring frame lift mechanism 26 is situated at a standby position located above a position where the adhesive tape DT is joined to a ring frame f. After completion of the operation of joining the adhesive tape DT to the ring frame f, the ring frame lift mechanism 26 moves downward, and then suction holds the ring frame f. Herein, the ring frame transport mechanism 17 holding the ring frame f before completion of the joining operation returns to an initial position located above the ring frame supply section 16.

Moreover, the ring frame lift mechanism 26 suction holding the ring frame f moves upward to a joining position where the ring frame f is joined to a wafer W. Herein, the chuck table 15 suction holding the wafer W moves downward to the joining position.

The mount frame preparation section 27 includes a joining roller 28 having a circumferential face which is elastically deformable. The joining roller 28 rolls on the non-adhesive surface of the adhesive tape DT while pressing the adhesive tape DT joined to a bottom side of the ring frame f against the wafer W.

The first mount frame transport mechanism 29 vacuum sucks a mount frame MF including the ring frame f and the wafer W integrated with each other, and then transfers the mount frame MF to a separation table (not illustrated) of the separation mechanism 30.

The separation mechanism 30 includes the separation table, a tape supply section 31, a separation unit 32 and a tape collection section 34. Herein, the separation table transports a wafer W placed thereon. The tape supply section 31 supplies a separating bonding tape (hereinafter, simply referred to as a "separating tape") Ts. The separation unit 32 performs a joining operation and a separating operation for the separating tape Ts. The tape collection section 34 collects the separating tape Ts together with a protective tape PT separated from the wafer W. Herein, the constituent elements of the separation mechanism 30 are fixedly provided in the semiconductor wafer mount apparatus 1, except the separation table.

The tape supply section 31 guides and supplies the separating tape Ts derived from an original tape roll to a lower end of the separation unit 32 through a guide roller.

The tape collection section 34 reels and collects the separating tape Ts fed from the lower end of the separation unit 32 so as to guide the separating tape Ts upward through a feed roller driven by a motor and a guide roller.

The separation unit 32 includes a separation plate 33. The separation plate 33 moves while pressing a surface of the protective tape PT joined to a patterned face of a wafer W (a wafer W joined to a ring frame f through the dicing tape DT in a mount frame MF) transported by the separation table. Herein, the separation plate 33 joins the separating tape Ts to the protective tape PT while pressing a non-adhesive surface of the separating tape Ts and, simultaneously, separates the protective tape PT together with the separating tape Ts. The separating tape Ts to be used herein has a width narrower than a diameter of the wafer W.

The second mount frame transport mechanism 35 vacuum sucks a mount frame MF supplied from the separation mechanism 30, and then transfers the mount frame MF to the turn table 36.

The turn table 36 performs alignment on the mount frame MF, and then the mount frame collection section 37 houses the mount frame MF. More specifically, a mount frame MF is placed on the turn table 36 by the second mount frame transport mechanism 35, and then is subjected to alignment on the basis of an orientation flat of a wafer W or a position of a ring frame f.

The turn table 36 is turned in order to change a direction that the mount frame collection section 37 houses a mount frame MF.

When the turn table 36 determines such a direction, a mount frame MF is pushed by a pusher (not illustrated), and then is housed in the mount frame collection section 37.

The mount frame collection section 37 is placed on a placement table (not illustrated) which is movable vertically. That is, when the placement table moves vertically, a mount frame MF pushed by the pusher can be housed in an any stage of the mount frame collection section 37.

With reference to FIGS. 1 to 12, next, description will be given of a series of operations performed by the semiconductor wafer mount apparatus 1 according to this embodiment.

First, initial conditions such as a thickness of an adhesive tape DT are inputted through an operating panel (not illustrated). After completion of the setting of the initial conditions, as illustrated in FIGS. 7 and 8, a control section 70 actuates the robot arm 67 to allow the displacement sensor 65 to move to the measurement position where the displacement sensor 65 is opposite to the cutter blade 42.

When the cutter blade 42 arrives at the measurement position, the bracket 68 is moved vertically by a predetermined distance, which is preset, such that the displacement sensor 65 is brought into contact with the cutting edge of the cutter blade 42. Herein, a displacement amount of a contact portion of the displacement sensor 65 is measured. A measured value is transmitted to the control section 70. The control section 70 compares the measured value with a predetermined reference value. The reference value used herein is set at a predetermined value which is less than the thickness of the adhesive tape DT on the basis of the state that the reference plane 62 of the cutter holder 43 is brought into contact with the displacement sensor 65. In accordance with a deviation obtained from the comparison by the control section 70, a rotation speed of the pulse motor 64 is calculated, and a signal based on the rotation speed is transmitted to the pulse motor 64. The pulse motor 64 rotates by reception of the signal; thus, the protruding length of the cutter blade 42 is adjusted.

Figure 6:
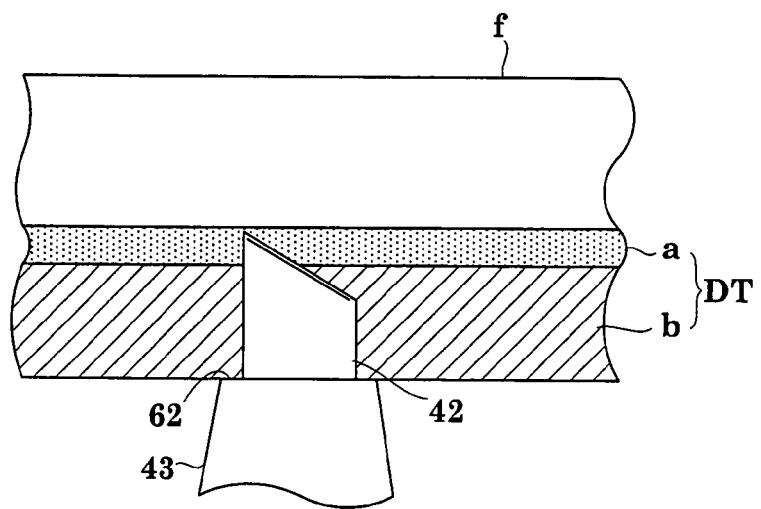
FIG. 6 is a sectional view illustrating a state that a supporting adhesive tape is stuck with the cutter blade.

As illustrated in FIG. 6, in this embodiment, the protruding length of the cutter blade 42 is set at a distance that the cutting edge of the cutter blade 42 is close to a joining interface between an adhesive layer a and a ring frame f in a state that the reference plane 62 of the cutter holder 43 comes into contact with a base b which is the non-adhesive surface of the adhesive tape DT. In other words, the protruding length is set such that the cutting edge of the cutter blade 42 does not penetrate through the adhesive layer a.

Thus, the setting of the tape cutting mechanism 24 is completed. Then, a process of preparing a mount frame MF in which a ring frame f holds a wafer W through an adhesive tape DT is executed as follows.

The wafer holding part of the arm 4 is inserted between wafers W housed in the cassette C, suction holds the wafer W from below, and takes the wafer W out of the cassette C. The arm 4 transports the wafer W to the alignment stage 7.

The wafer W is placed on the holding table by the arm 4, and then is suction held from below by the holding table. Herein, a pressure gauge (not illustrated) detects a suction level of the wafer W, and compares the detected level with a predetermined reference value in regard to a pressure value in a normal operation.

If the wafer W is suction held abnormally, the pressing plate 6 is pressed against a front face of the wafer W. Thus, the wafer W is suction held normally while being flattened (i.e., warpage of the wafer W is corrected). Herein, the wafer W is subjected to alignment on the basis of an orientation flat or a notch thereof.

After completion of the alignment by the alignment stage 7, the ultraviolet-ray irradiation unit 14 irradiates the front face of the wafer W with ultraviolet rays.

The alignment stage 7 moves toward the mount frame preparation section 27 in such a state that the wafer W irradiated with the ultraviolet rays is suction held by the holding table. That is, the alignment stage 7 moves to an intermediate position between the chuck table 15 and the ring frame lift mechanism 26.

When the alignment stage 7 is situated on standby at a predetermined position, the chuck table 15 situated above the alignment stage 7 moves downward. Thus, a bottom side of the chuck table 15 comes into contact with the wafer W, and the chuck table 15 starts to vacuum suck the wafer W. When the chuck table 15 starts to vacuum suck the wafer W, the holding table releases the suction of the wafer W. Thus, the wafer W is received by the chuck table 15 while being flattened (i.e., warpage of the wafer W is corrected). Thereafter, the alignment stage 7 returns to its initial position.

Next, one of ring frames f housed in the ring frame supply section 16 in a stacked manner is taken out of the ring frame supply section 16 while being vacuum sucked from above by the ring frame transport mechanism 17. The ring frame f is subjected to alignment at an alignment stage (not illustrated), and then is transported to an adhesive tape joining position located above an adhesive tape DT.

When the ring frame transport mechanism 17 transports the ring frame f to the adhesive tape joining position, the tape supply section 19 starts to supply the adhesive tape DT. Concurrently, the joining roller 22 moves to a joining operation start position.

When the joining roller 22 arrives at the joining operation start position, the tensioning mechanism 20 grasps both ends of the adhesive tape DT in a width direction and applies a tension to the adhesive tape DT in the width direction.

Figure 9:
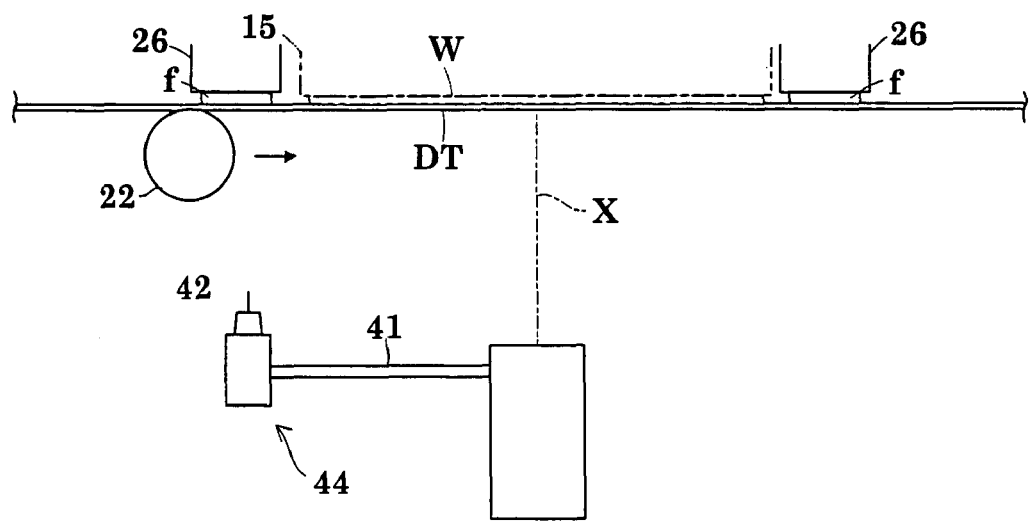
Figure 10:
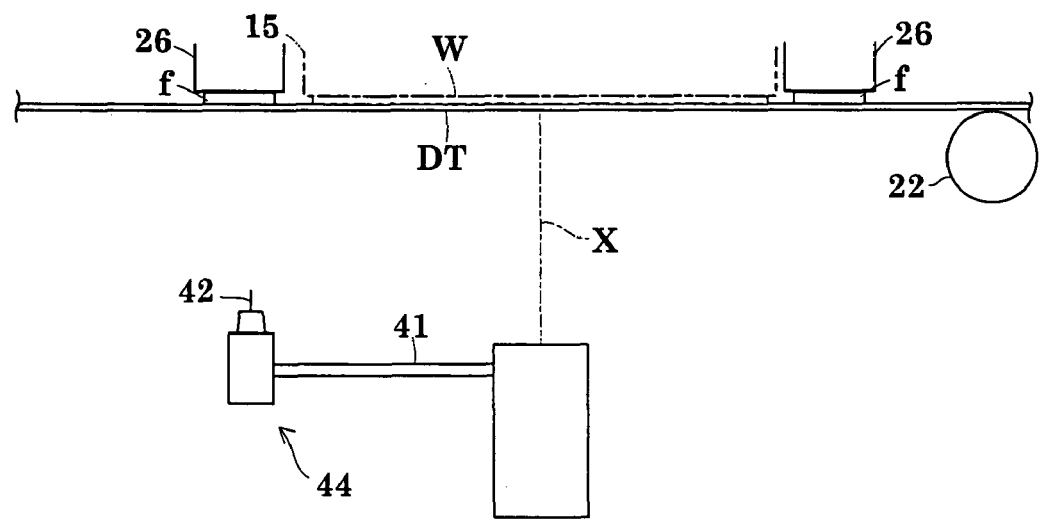

As illustrated in FIGS. 9 and 10, then, the joining roller 22 moves upward in order to join the adhesive tape DT to an end of the ring frame f while pressing the adhesive tape DT against the end of the ring frame f. Then, the joining roller 22 rolls on a non-adhesive surface of the adhesive tape DT toward the tape supply section 19. That is, the joining roller 22 returns to its standby position. Thus, the adhesive tape DT is joined to the ring frame f. When the joining roller 22 arrives at its standby position, the tensioning mechanism 20 releases the grasp of the adhesive tape DT.

Figure 11:
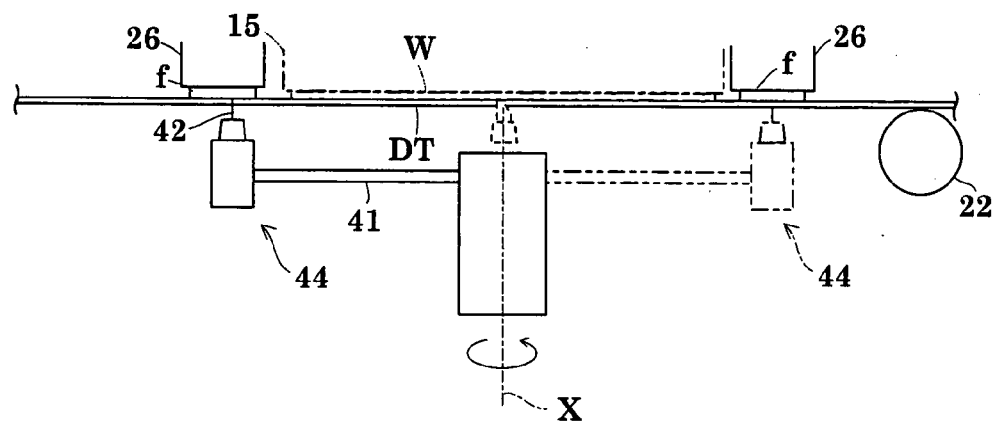
Figure 12:
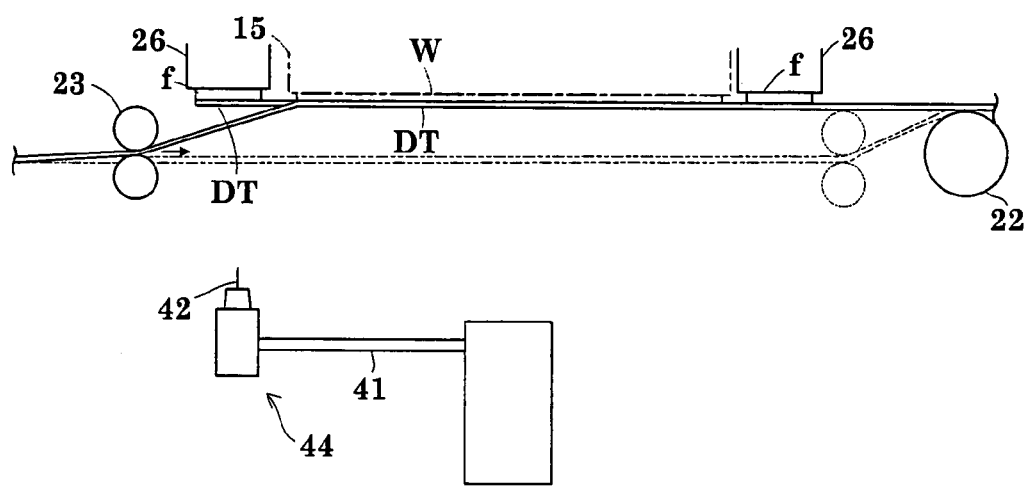

Concurrently, the tape cutting mechanism 24 moves upward, and the adhesive tape DT is stuck with the cutter blade 42 as illustrated in FIG. 11. As illustrated in FIG. 6, more specifically, the reference plane 62 of the cutter holder 43 is brought into contact with a surface of a base b forming the adhesive tape DT, and the adhesive tape DT is fixedly stuck with the cutting edge of the cutter blade 42 in such a degree that the cutting edge does not penetrate through an adhesive layer a. In this state, the motor 45 is driven to rotate such that the support arm 41 rotates about the vertical axis center X. Thus, the reference plane 62 of the cutter holder 43 follows the surface of the adhesive tape DT and a cutting portion of the cutter blade 42 is kept at a predetermined length, so that the cutter blade 42 cuts the adhesive tape DT along the contour of the ring frame f without penetrating through the adhesive layer a. After completion of the cutting of the adhesive tape DT, as illustrated in FIG. 12, the removal unit 23 moves toward the tape supply section 19 and removes the unnecessary portion of the adhesive tape DT from the ring frame f.

Then, the tape supply section 19 is actuated to unreel the adhesive tape DT therefrom, and the unnecessary portion of the cut adhesive tape DT is fed to the tape collection section 25. Herein, the joining roller 22 moves to the joining operation start position in order to join the adhesive tape DT to a next ring frame f.

The ring frame f, to which the adhesive tape DT is joined, is moved upward in such a manner that the ring frame lift mechanism 26 moves upward while suction holding a frame side of the ring frame f. Herein, the chuck table 15 moves downward. That is, each of the chuck table 15 and the ring frame lift mechanism 26 moves to a position where the ring frame f and the wafer W are joined to each other.

At the predetermined position, each of the chuck table 15 and the ring frame lift mechanism 26 is held by a holding mechanism (not illustrated). Next, the joining roller 28 moves to an adhesive tape joining operation start position. Herein, the joining roller 28 rolls on a non-adhesive surface of the adhesive tape DT joined to the bottom side of the ring frame f to join the adhesive tape DT to the wafer W. Thus, the ring frame f is joined to the wafer W through the supporting adhesive tape DT to prepare a mount frame MF.

After the preparation of the mount frame MF, the chuck table 15 and the ring frame lift mechanism 26 move upward, respectively. Herein, a holding table (not illustrated) moves below the mount frame MF, so that the mount frame MF is placed on the holding table. Then, the first mount frame transport mechanism 29 suction holds the mount frame MF placed on the holding table, and transfers the mount frame MF to the separation table.

The separation table, on which the mount frame MF is placed, moves below the separation unit 32. Thereafter, the separation plate 33 joins a separating tape Ts supplied from the tape supply section 31 to the protective tape PT on the front face of the wafer W while pressing the separating tape Ts against the protective tape PT. Concurrently, the separation plate 33 separates the protective tape PT together with the separating tape Ts from the front face of the wafer W.

After completion of the separation of the protective tape PT, the separation table, on which the mount frame MF is placed, moves to the standby position of the second mount frame transport mechanism 35.

The second mount frame transport mechanism 35 receives the mount frame MF from the separation mechanism 30, and then transfers the mount frame MF to the turn table 36. The mount frame MF placed on the turn table 36 is subjected to alignment on the basis of an orientation flat or a notch and is subjected to adjustment for a housing direction. After the alignment and the adjustment, the mount frame MF is pushed by the pusher and is housed in the mount frame collection section 37.

Thus, a series of the operations is completed. Herein, each time the tape cutting mechanism 24 cuts the adhesive tape DT by a predetermined number of times, the displacement sensor 65 measures the length of the cutter blade 42 protruding from the cutter holder 43. If there is a deviation in comparison between the measured value and the reference value, the pulse motor 64 is actuated to adjust the protruding length of the cutter blade 42 to a certain length.

As described above, in the case that the adhesive tape DT is struck with the cutter blade 42 and the cutter blade 42 cuts the adhesive tape DT along the contour of the ring frame f while traveling along the contour of the contour of the ring frame f, the reference plane 62 of the cutter holder 43 is brought into contact with the surface of the base b of the adhesive tape DT, thereby following the base b of the adhesive tape DT. Thus, the cutter blade 42 can cut the adhesive tape DT without penetrating through the adhesive layer a while passing by a joining interface. Accordingly, the cutter blade 42 does not come into contact with the tape joined side of the ring frame f, so that the service life of the cutter blade 42 can be prolonged. Thus, a frequency of exchange of the cutter blade 42 can be reduced, so that workability can be improved.

Even when the tape joined side of the ring frame f has a scratch, the cutting edge of the cutter blade 42 does not penetrate through the adhesive layer a and, therefore, is not fitted into the scratch. That is, it is possible to prevent a cutting pathway from changing due to an influence of the scratch on the tape joined side of the ring frame f. Thus, a cutting start position corresponds with a cutting end position, so that the adhesive tape can be cut with certainty.

Further, even when the cutter blade 42 cuts the adhesive tape DT in such a state that the cutting edge thereof comes into contact with the ring frame f, a flat plane 59 formed on the cutting edge of the cutter blade 42 prevents formation of a notched groove on the ring frame f. Accordingly, the ring frame f can be used repeatedly.

The present invention is not limited to the aforementioned embodiment, and may be modified variously as follows.

(1) In the foregoing embodiment, the adhesive tape DT may be cut in such a manner that the cutter holder 43 is brought into a non-contact state and the cutting edge of the cutter blade 42 does not penetrate through the adhesive layer a.

For example, a light source or a sound wave generator is disposed in front of the cutter blade 42 in the traveling direction. A sensor which is measurement means measures reflected light or sound wave from the ring frame f or the surface of the base b. The control section 70 calculates the distance from a result of the measurement. On the basis of a result of the calculation, further, the length of the cutter blade 42 protruding from the oval hole 61 of the cutter holder 43 may be adjusted in such a manner that a rotation speed of the pulse motor 64 is controlled.

Similarly, the sensor may measure the distance from the surface of the ring frame f to the cutting edge of the cutter blade 42, thereby correcting the position of the cutter blade 42 in accordance with a result of the measurement such that the cutting edge of the cutter blade 42 is close to the surface of the ring frame f.

(2) In the foregoing embodiment, the protruding length of the cutter blade 42 is measured by means of the pulse motor 64. Alternatively, a piezoelectric element capable of achieving finer adjustment may be used in place of the pulse motor 64.

(3) In the foregoing embodiment, the side of the ring frame f, to which the adhesive tape DT is joined, is directed downward. Alternatively, such a side may be turned upside down upon performance of joining, cutting and separating of the adhesive tape DT.

(4) In the foregoing embodiment, a joining roller may be used. That is, the adhesive tape DT is joined to the ring frame f. Thereafter, the wafer W is made close to the center of the ring frame f, and the joining roller joins the adhesive tape DT to the wafer W while pressing the adhesive tape DT against the wafer W.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for cutting a supporting adhesive tape through which a ring frame holds a semiconductor wafer, the method comprising the steps of:
cutting an adhesive tape along a contour of a ring frame while maintaining constant a distance from a reference plane of a cutter holder, which is an attachment base end of a cutter blade, to a cutting edge of the cutter blade penetrating through the adhesive tape joined to the ring frame and bringing the cutting edge of the cutter blade close to the ring frame;
measuring a distance from the reference plane to the cutting edge of the cutter blade with a measuring device each time the adhesive tape is cut by a predetermined number of times while the adhesive tape is cut with the cutter blade; and
maintaining the distance from the reference plane to the cutting edge of the cutter blade constant by adjusting a length of the cutter blade protruding from an oval hole of the cutter holder in accordance with a result of the measurement.

2. A method for cutting a supporting adhesive tape through which a ring frame holds a semiconductor wafer, the method comprising the steps of
measuring a thickness of an adhesive tape on a cutting pathway of a cutter blade while cutting the adhesive tape with the cutter blade;
adjusting a length of the cutter blade protruding from an oval hole of the cutter holder in accordance with a result of the measurement; and
continuing cutting the adhesive tape while maintaining the distance from the reference plane to the cutting edge of the cutter blade constant by adjusting a length of the cutter blade protruding from an oval hole of the cutter holder in accordance with a result of the measurement.

3. The method of claim 2, wherein
light is emitted to the adhesive tape, both light which transmits through the adhesive tape and is reflected from the ring frame and light which is reflected from a surface of the adhesive tape are received, and the thickness of the adhesive tape is measured on the basis of at least one of intensity and timing of the reflected light.

4. The method of claim 1, wherein
light is emitted to the adhesive tape, both light which transmits through the adhesive tape and is reflected from the ring frame and light which is reflected from a surface of the adhesive tape are received, and a thickness of the adhesive tape is measured on the basis of at least one of intensity and timing of the reflected light.

* * * * *